(12) United States Patent
Dey et al.

(10) Patent No.: US 8,477,052 B2
(45) Date of Patent: Jul. 2, 2013

(54) METHOD AND APPARATUS FOR SELF-TEST OF SUCCESSIVE APPROXIMATION REGISTER (SAR) A/D CONVERTER

(75) Inventors: Sanjoy K. Dey, Noida (IN); Michael T. Berens, Austin, TX (US); James R. Feddeler, Austin, TX (US); Vikram Varma, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 114 days.

(21) Appl. No.: 13/079,818

(22) Filed: Apr. 5, 2011

(65) Prior Publication Data

US 2012/0256774 A1 Oct. 11, 2012

(51) Int. Cl.
*H03M 1/10* (2006.01)

(52) U.S. Cl.
USPC ........... 341/120; 341/118; 341/119; 341/144; 341/155; 341/172

(58) Field of Classification Search
USPC .................................. 341/118, 120, 144, 172
See application file for complete search history.

(56) References Cited

U.S. PATENT DOCUMENTS

| | | | |
|---|---|---|---|
| 4,222,107 A | 9/1980 | Mrozowski et al. | |
| 4,272,760 A | 6/1981 | Prazak et al. | |
| 4,348,658 A | 9/1982 | Carter | |
| 4,399,426 A | 8/1983 | Tan | |
| 4,451,821 A | 5/1984 | Domogalla | |
| 4,599,604 A | 7/1986 | McKenzie et al. | |
| 4,679,028 A | 7/1987 | Wilson et al. | |
| 4,970,514 A | 11/1990 | Draxelomayr | |
| 5,132,685 A | 7/1992 | DeWitt et al. | |
| 5,235,333 A * | 8/1993 | Naylor et al. | 341/118 |
| 5,361,067 A | 11/1994 | Pinckley | |
| 5,594,555 A | 1/1997 | Ishida | |
| 5,594,612 A | 1/1997 | Henrion | |
| 5,675,340 A * | 10/1997 | Hester et al. | 341/156 |
| 5,687,003 A | 11/1997 | Nagano | |
| 5,691,720 A | 11/1997 | Wang et al. | |
| 5,764,175 A | 6/1998 | Pan | |
| 5,818,370 A | 10/1998 | Sooch et al. | |
| 5,977,893 A * | 11/1999 | Chen et al. | 341/120 |
| 6,075,478 A | 6/2000 | Abe | |
| 6,268,813 B1 * | 7/2001 | de Wit | 341/120 |
| 6,340,944 B1 | 1/2002 | Chang et al. | |
| 6,348,885 B1 | 2/2002 | Munoz et al. | |
| 6,362,762 B1 | 3/2002 | Jensen et al. | |
| 6,400,302 B1 | 6/2002 | Amazeen et al. | |
| 6,404,375 B1 | 6/2002 | Munoz | |
| 6,417,794 B1 | 7/2002 | Munoz | |
| 6,424,276 B1 | 7/2002 | Munoz et al. | |
| 6,433,712 B1 | 8/2002 | Ohnhaeuser et al. | |
| 6,448,911 B1 | 9/2002 | Somayajula | |
| 6,486,806 B1 * | 11/2002 | Munoz et al. | 341/120 |

(Continued)

OTHER PUBLICATIONS

De Vriesm R. et al., "Built-in Self-Test Methodology for A/D Converters", 1997 European Design and Test Conference, Mar. 17-20, 1997; pp. 353-358, IEEE.

(Continued)

*Primary Examiner* — Linh Nguyen
(74) *Attorney, Agent, or Firm* — Charles Bergere

(57) ABSTRACT

A single-ended SAR ADC includes an additional capacitor, a self-test engine, and independent control of sample and hold conditions, which allows for quick and accurate testing of the ADC.

6 Claims, 3 Drawing Sheets

U.S. PATENT DOCUMENTS

| | | | |
|---|---|---|---|
| 6,559,789 B1 | 5/2003 | Somayajula | |
| 6,621,431 B2 | 9/2003 | Engl et al. | |
| 6,791,484 B1 | 9/2004 | Lee et al. | |
| 6,864,820 B2 | 3/2005 | Nakamura et al. | |
| 6,882,298 B2 | 4/2005 | Leung et al. | |
| 6,891,487 B2 | 5/2005 | Leung et al. | |
| 6,924,755 B1 | 8/2005 | Callanan et al. | |
| 6,940,445 B2 | 9/2005 | Kearney | |
| 6,965,332 B2 | 11/2005 | Nakamura et al. | |
| 6,975,950 B2 | 12/2005 | Bardsley | |
| 7,158,070 B1 | 1/2007 | Yang et al. | |
| 7,180,439 B1 | 2/2007 | Bakker | |
| 7,199,746 B1* | 4/2007 | Chowdhury et al. | 341/172 |
| 7,271,758 B2* | 9/2007 | Piasecki et al. | 341/172 |
| 7,439,898 B1 | 10/2008 | Nittala et al. | |
| 7,443,323 B2 | 10/2008 | Rotchford et al. | |
| 7,705,765 B1* | 4/2010 | Yang | 341/172 |
| 7,880,650 B2* | 2/2011 | Feddeler et al. | 341/120 |
| 2007/0018939 A1 | 1/2007 | Chen et al. | |
| 2008/0084340 A1* | 4/2008 | Hurrell | 341/131 |
| 2009/0075610 A1 | 3/2009 | Keehr et al. | |
| 2009/0201237 A1 | 8/2009 | Nishimura | |
| 2009/0244014 A1* | 10/2009 | Hotelling et al. | 345/173 |
| 2010/0079317 A1* | 4/2010 | Feddeler et al. | 341/120 |
| 2011/0122006 A1* | 5/2011 | Liao et al. | 341/120 |

OTHER PUBLICATIONS

Lee; "A Self-Calibrating 15 bit CMOS A/D Converter"; IEEE Journal of Solid-State Circuits; vol. SC-19, No. 6; Dec. 1984.

Neubauer; "A Successive Approximation A/D Converter with 16bit 200kS/s in 0.6pm CMOS using Self-Calibration and Low Power Techniques"; IEEE; 2001.

Gulati et al., "A Low Power Reconfigurable Analog-to-Digital Converter", IEEE Journal of Solid-State Circuits, vol. 36, No. 12, Dec. 2001, pp. 1900-1911.

Hester et al., "Fully Differential ADC with Rai-to-Rail Common-Mode Range and Nonlinear Capacitor Compensation", IEEE Journal of Solid State Circuits, vol. 25, No. 1, Feb. 1990.

* cited by examiner

US 8,477,052 B2

METHOD AND APPARATUS FOR SELF-TEST OF SUCCESSIVE APPROXIMATION REGISTER (SAR) A/D CONVERTER

BACKGROUND OF THE INVENTION

The present invention relates generally to analog to digital converters (ADCs) and more particularly to testing single-ended and differential successive approximation register (SAR) ADCs.

SAR ADCs are used to convert a continuous analog signal into a binary value. For example, a 12-bit SAR ADC converts an analog input voltage into a 12-bit binary representation. The SAR ADC operates using a binary search principle and converges to a digital output for each analog to digital conversion. A SAR ADC includes a digital-to-analog converter (DAC) and a comparator in a feedback loop with a SAR register. The DAC is formed of an array of binary weighted elements such as capacitors and/or resistors. Each binary weighted element corresponds to a binary digit of a corresponding binary representation. To generate a 12-bit binary representation, the DAC includes twelve (12) binary weighted elements and a dummy element.

During an analog to digital conversion, an input voltage is sampled during a sample phase. During a compare phase the DAC binary weighted elements are used to successively approximate the input voltage. At each successive approximation step, the comparator output is stored in the SAR register and the resulting digital word provides the digital representation of the analog input voltage.

Similar to other electronic components, ADCs are also prone to manufacturing defects, which include incorrect capacitance values, non-functional voltage switching circuit, defective comparator, and so forth. These defects lead to erroneous outputs from the ADCs. Thus, testing the ADCs for the above mentioned faults prior to being dispatched to customers is required.

Traditionally the ADCs are tested by providing test input voltages representing each of the conversion result values. To account for noise and to precisely calculate the error, the test input voltage is varied in multiple steps in the range of each conversion result value. However, this test technique is time consuming, which leads to prolonged test times and requires expensive test equipment, both of which directly increase test costs.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
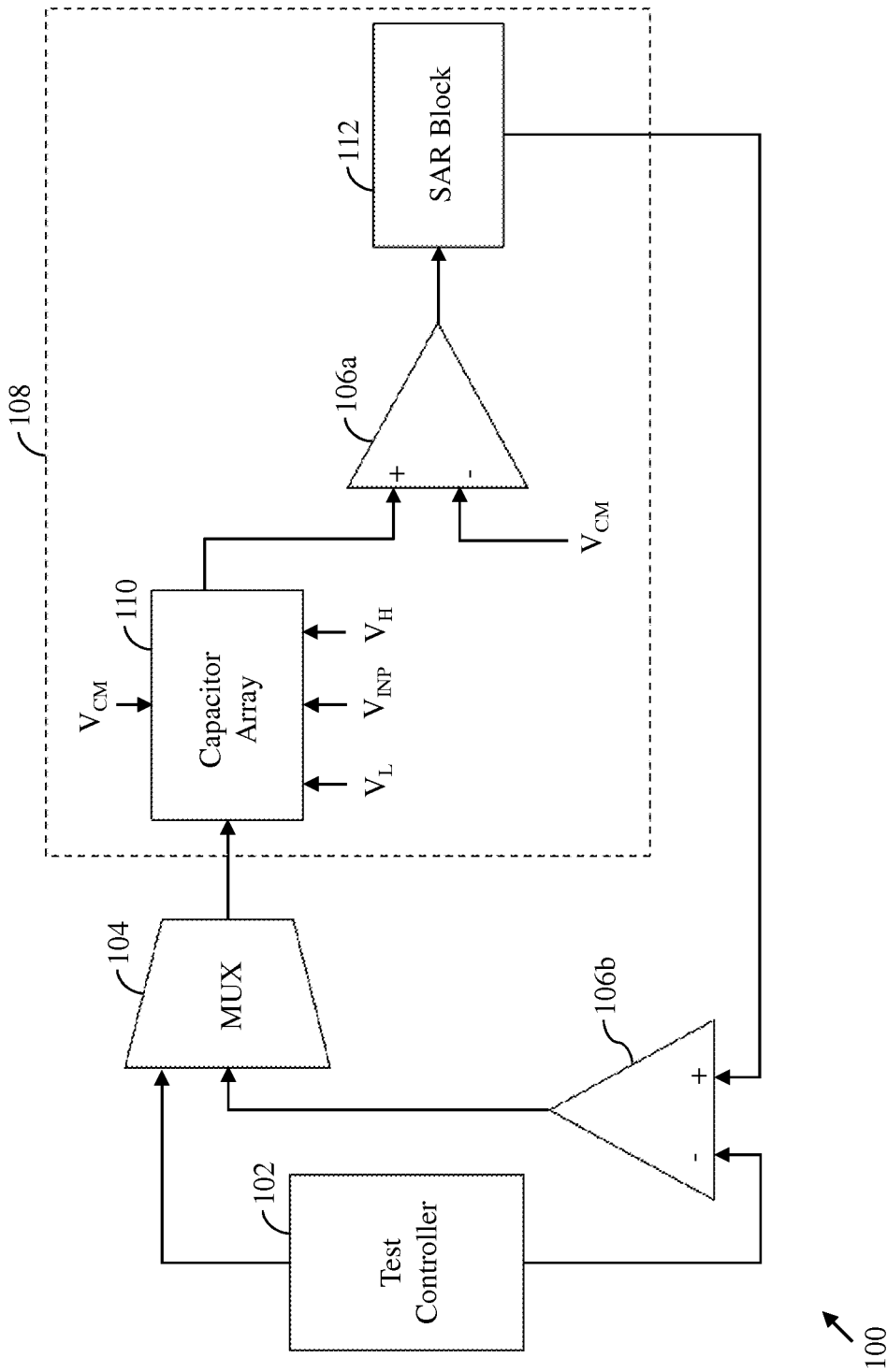
FIG. 1 is a schematic block diagram illustrating an ADC in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a method for testing an analog to digital converter (ADC) is provided in which the ADC includes a capacitor array, and a comparator and an SAR block. The capacitor array includes binary weighted capacitors and an additional capacitor. The method includes charging the second plates of all capacitors to a third voltage. The method also includes selecting a test capacitor (capacitor under test or CUT) from the capacitor array for testing. A first voltage is applied to the first plates of the first capacitors. The first capacitors include the capacitors in the capacitor array that have a capacitance value less than that of the test capacitor and the additional capacitor. A second voltage is applied to the first plates of the test capacitor and second capacitors. The second capacitors include capacitors in the capacitor array that have capacitances greater than the capacitance value of the test capacitor. The connection to the second plates of the capacitors in the capacitor array is disconnected. The first voltage is applied to the CUT. The second voltage is applied to the capacitors that have a capacitance value less than that of the CUT and the additional capacitor.

Subsequently, successive approximation is performed to determine a binary code corresponding to the voltages on the one or more binary weighted capacitors. The binary code is compared with a predetermined value to generate an ADC status signal, in which the ADC status signal indicates either a pass status or a fail status of the ADC.

In another embodiment of the present invention, a system for testing an ADC is provided. The system includes a capacitor array including one or more binary weighted capacitors and an additional capacitor, the first plates of the various capacitors belonging to the capacitor array are connected to a first voltage terminal. The system further includes a test controller, connected to the capacitor array, for switching the one or more first plates and one or more of second plates of the capacitor array between the first voltage terminal, a second voltage terminal, and a third voltage terminal. The first voltage terminal is at a first voltage, the second voltage terminal is at a second voltage, and the third voltage terminal is at a third voltage.

Further, the system includes a successive approximation register, connected to the test controller, for calculating a digital code corresponding to the capacitor array. Additionally, the system includes a comparison block for comparing the digital code with a predetermined value to generate an ADC status signal in which the ADC status signal indicates either a pass status or a fail status of the ADC.

Embodiments of the present invention provide a system and method for testing an ADC. The ADC is tested by testing the binary weighted capacitors in the capacitor array of the ADC for having a desired value of capacitance. The testing is accomplished by charging the top and bottom plates of the capacitors in the capacitor array to at least one of the first voltage, the second voltage, and third voltage and comparing a binary code corresponding to the binary weighted capacitors with a predetermined value. The capacitance value of each binary weighted capacitor is tested either directly or indirectly. For example, the binary weighted capacitor selected for testing is tested directly and the remaining capacitors which aid in the testing of the selected capacitor are tested indirectly. Further, the testing of the ADC is accomplished by the addition of an additional capacitor. The value of the additional capacitor is chosen such that upon insertion in the capacitor array, the additional capacitor occupies minimum area. Additionally, the testing of the ADC does not require expensive test equipment, thereby reducing the test costs. Since no additional test equipment is required, testing is performed in less time compared to the conventional test methods. Thus, test time and time to market of the chip is reduced.

FIG. 1 is a schematic diagram illustrating a system 100 for testing an ADC in accordance with an embodiment of the present invention. The system 100 includes a test controller 102, a multiplexer (MUX) 104, first and second comparators 106 and 107, an ADC 108, a capacitor array 110, a SAR 112.

The ADC 108 converts analog input voltage ($V_{INP}$) to a corresponding binary value. In an embodiment of the present invention, the ADC 108 is a single-ended SAR ADC. In an embodiment of the present invention, the ADC 108 has a resolution of n bits in which 'n' is a positive integer greater than 1. Further, the capacitor array 110 includes binary weighted capacitors and an additional capacitor (not shown). It should be realized by the persons skilled in the art that the binary weighted capacitors are similar to the binary weighted capacitors used in the existing single-ended SAR ADCs in which each binary weighted capacitor corresponds to a binary digit of the binary value obtained from the ADC. The capacitor array 110 is explained in detail in conjunction with FIG. 2.

Further, the additional capacitor is provided to aid in the testing of the ADC 108. A switching circuit is used to charge the second plates (top plates) of the binary weighted capacitors and the top plate of the additional capacitor to a third voltage (common mode voltage ($V_{CM}$)). The third voltage is provided by connecting the top plates to a third voltage terminal. Additionally, the first plates (bottom plates) of the binary weighted capacitors and the additional capacitor may be switched between a first voltage $V_H$, a second voltage $V_L$, and a fourth voltage $V_{INP}$, where $V_L \leq V_{INP} \leq V_H$.

The fourth voltage $V_{INP}$ is an external analog input voltage. The first, second, and fourth voltages are provided by connecting the bottom plates to the first, second, and fourth voltage terminals, respectively. Each of the binary weighted capacitors is tested by connecting the top and bottom plates of the various capacitors in the capacitor array 110 to either of the first, second, and third voltage terminals. The capacitor array 110 and its usage in testing of the ADC 108 are explained in detail conjunction with FIG. 2.

Further, the capacitor array 110 is connected to the MUX 104 which in turn is connected to the test controller 102. The MUX 104 switches an operating mode of the capacitor array between a test mode and a normal mode, in which the test mode is used to perform the test on the ADC and the normal mode is used as the user mode. Further, the test controller 102 stores the test instructions for performing test on the ADC 108. The test instructions include a series of steps (explained in detail in conjunction with FIG. 3) for controlling the switching circuit mentioned above for switching the top and the bottom plates of the capacitors in the capacitor array 110 between the first, the second, and third voltage terminals.

Further, the capacitor array 110 is connected to the positive terminal of the first comparator 106. The negative terminal of the first comparator 106 is connected to the third voltage terminal for providing the third voltage V. During testing of the ADC 108, the first comparator 106 compares the voltages provided at the positive and the negative terminals and provides a binary output corresponding to each comparison. In an embodiment of the present invention, the first comparator 106 is an analog voltage comparator having the desired resolution for the n-bit ADC.

Further, the output terminal of the first comparator 106 is connected to the SAR 112. The SAR 112 stores the binary output provided by the first comparator 106 subsequent to each comparison. At the end of testing the ADC 108, the binary value stored in the SAR 112 is used to determine whether the ADC 108 has a fault.

The SAR 112 is connected to the second comparator 107. The second comparator 107 is also connected to the test controller 102 and to the MUX 104. The second comparator 107 receives the binary value stored in the SAR 112 at the end of the test and compares the binary value with a predetermined value stored in the test controller 102 to determine whether the ADC 108 has a fault. If it is determined that the ADC 108 has a fault, the second comparator generates an ADC status signal that indicates at least one of a pass status or a fail status of the ADC 108.

Figure 2:
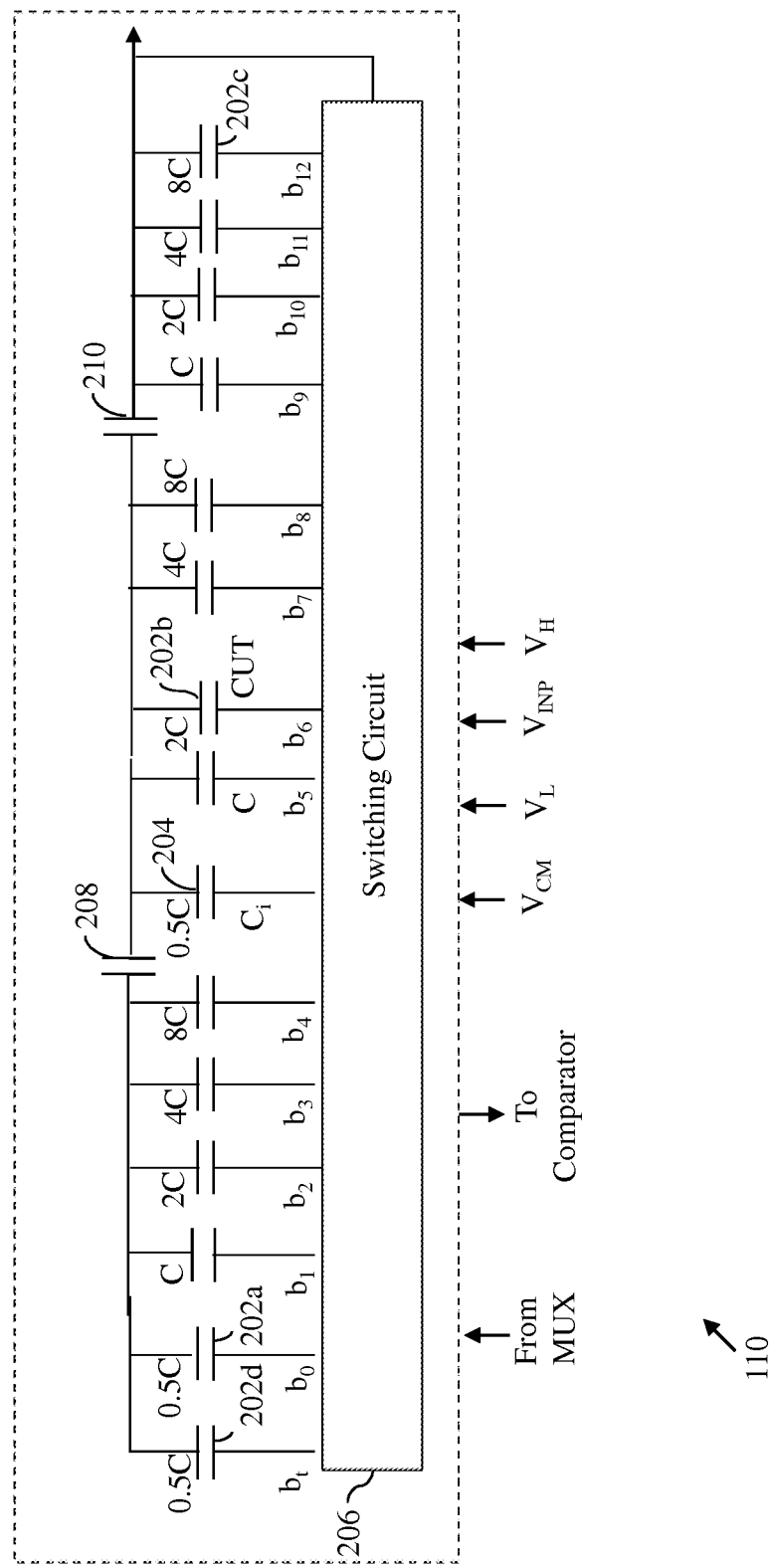
FIG. 2 is a schematic diagram illustrating a capacitor array in accordance with an embodiment of the present invention.

FIG. 2 is a schematic diagram illustrating the capacitor array 110 in detail, in accordance with an embodiment of the present invention. The capacitor array 110 includes one or more binary weighted capacitors, such as capacitors 202a, 202b, and 202c corresponding to binary digits $b_0$, $b_6$, and $b_{12}$ respectively. The remaining binary weighted capacitors shown to be a part of the capacitor array 110 correspond to the remaining binary digits $b_1$, $b_2$, $b_3$, $b_4$, $b_5$, $b_8$, $b_9$, $b_{10}$, and $b_{11}$. The capacitor array 110 further includes a dummy capacitor 202d. Still further, the capacitor array 110 includes an additional capacitor 204 ($C_i$), a switching circuit 206 and two scaling capacitors 208 and 210.

Each binary weighted capacitor in the capacitor array 110 has a value that is twice the value of an adjacent binary weighted capacitor corresponding to a less significant bit. For example, a binary weighted capacitor corresponding to bit 4 has twice the capacitance of the binary weighted capacitor corresponding to bit 3 (where bit 0 is the least significant bit (LSB)). A person skilled in the art will appreciate that the binary weighted capacitors are implemented using scaling capacitors to reduce effective area of the capacitor array. This solution is conventionally used in the art of ADCs. The capacitor array shown in FIG. 3 includes two scaling capacitors 208 and 210. The values of scaling capacitors 208 and 210 are chosen according to predetermined criteria. For example, the scaling capacitor 208 is chosen such that the equivalent capacitance of the scaling capacitor 208 in series with the capacitor corresponding to bit 4 seen from the capacitor corresponding to bit 5 is half the value of the capacitor corresponding to bit 5. Exemplary capacitance values for all capacitors are shown in FIG. 2. However, the present invention should not be construed to be limited only to the values shown in FIG. 2.

Further, the additional capacitor 204 ($C_i$) aids in performing a test on the ADC 108 (refer FIG. 1).

The top plates of the various capacitors in the capacitor array 110 are connected through a common terminal to the switching circuit 206. Further, the bottom plates of the various capacitors in the capacitor array 110 are individually connected to the switching circuit 206. The switching circuit 206 provides the top plates, the third voltage V. Further, the switching circuit 206 switches the bottom plates of each capacitor in the capacitor array 110 between one or more voltages ($V_L$, $V_{INP}$, $V_H$). The switching circuit 206 accomplishes this by the use of multiple switches (not shown) connected to the bottom plates of the various capacitors of the capacitor array 110.

The test is performed by selecting one of the binary weighted capacitors as a capacitor under test (CUT). Then the top and bottom plates of the various capacitors in the capacitor array 110 are connected to different voltage terminals that are at different voltages ($V_L$, $V_H$, $V_{CM}$). The top and bottom plates are switched between the various voltage terminals based on predetermined test instructions received from test controller 102 (refer FIG. 1). Subsequent to switching the top and bottom plates between various voltage terminals, successive approximation is performed to determine a binary code corresponding to the voltage values of the one or more binary weighted capacitors. The binary code is then compared with a predetermined value stored in the test controller 102 to determine whether the CUT has a desired capacitance value. The above steps are performed on the various binary weighted capacitors of the capacitor array 110 to determine whether the capacitors have a desired value.

Figure 3:
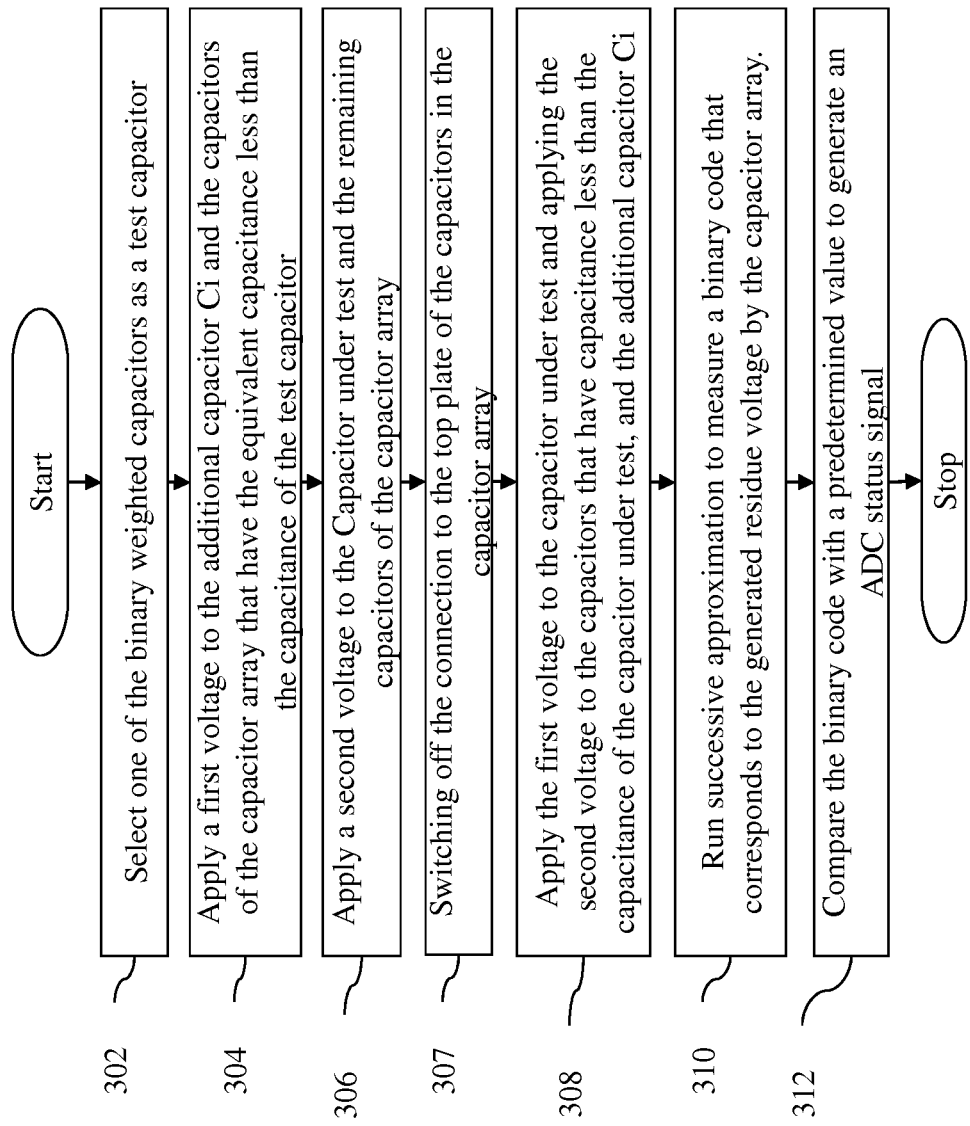
FIG. 3 is a flowchart illustrating a method for testing a capacitor in an ADC, in accordance with an embodiment of the present invention.

FIG. 3 is a flowchart illustrating a method for testing a capacitor in an ADC, in accordance with an embodiment of the present invention.

At step 302, a capacitor is selected from the binary weighted capacitors as a capacitor under test (CUT), such as a binary weighted capacitor 202b. The binary weighted capacitors belong to a capacitor array, such as the capacitor array 110. In an embodiment of the present invention, the capacitor array includes one or more binary weighted capacitors, an additional capacitor, a dummy capacitor and two scaling capacitors. It should be realized by persons skilled in the art that the dummy capacitor aids in the successive approximation process. The capacitor array has been explained in detail in conjunction with FIG. 2.

Further, the CUT is tested for having a desired capacitance value. It should be realized by persons skilled in the art that each of the binary weighted capacitors belonging to a capacitor array has a predetermined capacitance value that is twice the value of an adjacent binary weighted capacitor corresponding to a less significant bit. If the capacitance value is different from the predetermined value then the ADC does not produce the desired results.

Further, the top plates of the various capacitors in the capacitor array, such as a capacitor array 110, are charged to a third voltage (common mode voltage ($V_{CM}$)). In an embodiment of the present invention, the top plates are connected to the third voltage terminal (common mode terminal) to charge them to the third voltage using a switching circuit, such as a switching circuit 206. In an embodiment of the present invention, the switching circuit operates using signals received from a test controller, such as the test controller 102.

At step 304, a first voltage ($V_H$) is applied to the additional capacitor 201 ($C_i$) and the other capacitors of the capacitor array that have equivalent capacitance less than the capacitance of the CUT. For example, when the CUT is the binary weighted capacitor 202b that corresponds to binary digit $b_6$, the binary weighted capacitors corresponding to binary digits $b_5$-$b_0$, additional capacitor 201($C_i$) and the dummy capacitor 202d are charged to $V_H$. Applying the first voltage to the capacitors includes connecting the bottom plates thereof to a first voltage terminal to charge them to $V_H$. In an embodiment of the present invention, the bottom plates of the capacitors are connected to the first voltage terminal by the switching circuit, such as the switching circuit 206. The switching circuit switches the bottom plates by the use of multiple switches, each of which is connected individually to the bottom plates of the various capacitors of the capacitor array 110, thereby enabling selective charging of the bottom plates of one or more capacitors.

At step 306, a second voltage ($V_L$) is applied to the remaining capacitors of the capacitor array. The remaining capacitors include the CUT and the capacitors that have equivalent capacitance greater than the capacitance of the CUT. For example, when the CUT is the binary weighted capacitor 202b which corresponds to binary digit $b_6$ (refer FIG. 2), the binary weighted capacitors corresponding to binary digits $b_7$-$b_{12}$ and the CUT are charged to $V_L$. Applying the second voltage to the remaining capacitors includes connecting the bottom plates thereof to a second voltage terminal to charge them to $V_L$. In an embodiment of the present invention, the bottom plates of the remaining capacitors are connected to the second voltage terminal by the switching circuit, such as the switching circuit 206.

At step 307, a switching circuit, such as the switching circuit 206, switches off the connection to the top plate of the capacitors in the capacitor array.

At step 308, $V_H$ is applied to the CUT and $V_L$ is applied to the capacitors that have equivalent capacitance less than the capacitance of the CUT, and the additional capacitor ($C_i$). In an embodiment of the present invention, the voltages $V_H$ and $V_L$ are applied using a switching circuit, such as the switching circuit 206. At step 310, successive approximation is run to measure a binary code that corresponds to the generated residue voltage by the capacitor array 110 during the switching sequence in steps 302-308. Here, the binary code represents the error in the value of the CUT. The successive approximation is accomplished using a comparator, such as a first comparator 106 and a SAR, such as the SAR 112. Since the successive approximation process followed is similar to the one used in the known in the art ADCs, a detailed explanation has been excluded for the purpose of brevity.

At step 312, the binary code is compared with a predetermined value to generate an ADC status signal. The ADC status signal indicates a pass status or a fail status of the ADC. The binary code generated is representative of the capacitance value of the second capacitors (that have capacitance values less than the CUT) and the additional capacitor. Thus by comparing the binary code with the sum of desired capacitance values of the second capacitors and a predetermined value of the capacitance of the additional capacitor (the above sum of capacitances is equal to the predetermined value stored in the test controller), the CUT is analyzed for a desired capacitance value. In an embodiment of the present invention, the additional capacitor aids in testing of the ADC by enabling convergence of the successive approximation process. Being occupied in the test method with the bottom plate always at $V_H$ during the successive approximation process, the CUT cannot take part in this step. This leaves a gap in the binary weighted capacitors required for the successive approximation process to converge in the single-ended SAR ADC. The additional capacitor 204 ($C_i$) bridges the gap and aids the test method to converge. Further, the capacitance value of $C_i$ is determined such that the test method overcomes the zero-scale error and is capable of measuring the maximum desirable/calculated error of the CUTs, and can be placed in a suitable place in the capacitor array 110 to accomplish only little increment in area.

Further, the various steps described above may be classified into different phases. For example, step 304 and step 306 may be classified as a sample phase, step 308 may be classified as a hold phase, and step 310 may be classified as a compare phase. It should be realized by persons skilled in the art that the sample, the hold, and the compare phases are in conformity with the sample, the hold, and the compare phases associated with the known in the art of ADCs.

The flow chart of FIG. 3 shows steps that are executed for testing a single unit of capacitor of the capacitor array 110. The steps need to be repeated to test the individual capacitors of the capacitor array 110.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A method for testing an analog to digital converter (ADC), the ADC including a capacitor array, wherein the capacitor array includes one or more binary weighted capacitors and an additional capacitor, the method comprising:
   selecting one of the binary weighted capacitors as a test capacitor;
   applying a first voltage to the first plate of the additional capacitor and the capacitors of the capacitor array that have capacitance less than the capacitance of the test capacitor;
   applying a second voltage to the first plate of the remaining capacitors of the capacitor array, wherein the remaining capacitors comprise the capacitor under test and the capacitors that have a capacitance greater than the capacitance of the capacitor under test;
   switching off the connection to a second plate of the one or more binary weighted capacitors;
   applying the first voltage to the capacitor under test and applying the second voltage to the capacitors that have capacitance less than the capacitance of the capacitor under test and the additional capacitor;
   running successive approximation to measure a binary code that corresponds to the generated residue voltage by the capacitor array, wherein the binary code represents the error in the value of the test capacitor; and
   comparing the binary code with a predetermined value to generate an ADC status signal, wherein the ADC status signal indicates at least one of a pass status or fail status of the ADC.

2. The method of claim 1, wherein the first voltage is a high reference voltage and the second voltage is a low reference voltage.

3. The method of claim 2, wherein applying the first voltage to the first plate of the additional capacitor and the capacitors of the capacitor array that have capacitance less than the capacitance of the test capacitor comprises connecting first plates of the capacitors to a first voltage terminal by a switching circuit.

4. The method of claim 2, wherein applying the second voltage to the first plate of the remaining capacitors comprises connecting the first plates of the remaining capacitors to a second voltage terminal by the switching circuit.

5. The method of claim 1, further comprising connecting second plates of the capacitors of the capacitor array to a third voltage terminal for charging the second plates to a third voltage, wherein the third voltage is a common mode voltage.

6. The method of claim 1, wherein measuring the binary code comprises performing successive approximation using a successive approximation register.

* * * * *